(12) United States Patent
Omura

(10) Patent No.: US 6,222,267 B1
(45) Date of Patent: Apr. 24, 2001

(54) SEMICONDUCTOR DEVICE AND MANUFACTURING THEREOF

(75) Inventor: Masayoshi Omura, Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/094,963

(22) Filed: Jun. 12, 1998

(30) Foreign Application Priority Data

Jun. 17, 1997 (JP) .................................... 9-160119

(51) Int. Cl.[7] .......................... H01L 23/48; H01L 23/52; H01L 29/40
(52) U.S. Cl. .......................... 257/741; 257/740; 438/621; 438/653; 438/906
(58) Field of Search .................................... 438/653, 906, 438/687, 688, 621; 257/741, 748, 761, 762, 763, 740

(56) References Cited

U.S. PATENT DOCUMENTS 5,094,981 * 3/1992 Chung et al. .......................... 438/621
5,236,868 * 8/1993 Nulman .
5,421,974 * 6/1995 Witt .................................. 204/192.25

FOREIGN PATENT DOCUMENTS 8-69980   3/1996  (JP) .

OTHER PUBLICATIONS

Hiroshi Nishimura, et al. "Reliable Submicron Vias Using Aluminum Alloy High Temperature Sputter Filling" Proc. 8th International IEEE VLSI Multilevel Interconnect. Conf., Jun. 1991.*

* cited by examiner

Primary Examiner—Caridad Everhart (57) ABSTRACT

A semiconductor device has: a silicon substrate; a plurality of impurity doped regions formed in a surface layer of the silicon substrate; contact layers each in contact with a surface of associated one of the plurality of impurity doped regions, the contact layer being made of an alloy selected from a group consisting of TiMo, TiV, TiW, TiMoNb, TiMoTa, TiMoV, TiMoW, TiNbV, TiNbW, TiMoNbTa, TiMoNbV, TiMoNbW, TiMoTaW, TiMoVW, TiNbTaW, TiNbVW, TiMoNbTaW, TiMoNbVW, and the like; barrier layers each disposed on associated one of the contact layers and made of refractory metal nitride or refractory metal oxynitride; and a metal wiring layer disposed on each of the barrier layers. The semiconductor device capable of lowering contact resistances between the metal wiring layers and n-type and p-type impurity doped regions of the silicon substrate, as well as its manufacture method are provided.

17 Claims, 5 Drawing Sheets

SEMICONDUCTOR DEVICE AND MANUFACTURING THEREOF

This application is based on Japanese Patent Application No. 9-160119 filed on Jun. 17, 1997, the entire contents of which are incorporated herein by reference.

BACKGROUND OF THE INVENTION a) Field of the Invention

The present invention relates to a semiconductor device and its manufacture method, and more particularly to a semiconductor device and its manufacture method capable of providing a low contact resistance between impurity doped regions in a surface layer of a silicon substrate and a wiring layer.

b) Description of the Related Art

A region heavily doped with impurities in the surface layer of a silicon substrate is electrically connected to a wiring layer of Al or Al alloy formed thereon by inserting a barrier metal layer therebetween for blocking solid diffusion of atoms in the substrate and in the wiring layer. The barrier metal layer improves the reliability of the contact area.

Known barrier metal materials are refractory metal silicide such as $WSi_2$ and $MoSi_2$ and refractory metal alloy such as TiW. In order to improve thermal endurance and barrier performance, a lamination structure of a refractory metal layer and a refractory metal nitride layer such as a lamination structure of TiN and Ti, and a lamination structure of HfN and Ti, has been recently used.

A contact resistance between a metal wiring layer and a semiconductor substrate depends on an impurity concentration of the semiconductor substrate and a work function of the metal. A contact resistivity $\rho_c$ is given by:

$$\rho_c = C \times exp(4\pi(\epsilon_s m^*)^{1/2}/(qh) \times (\phi_B/N_D)) \quad (1)$$

where $\phi_B$ is a Schottky barrier height at an interface between semiconductor and metal, $N_D$ is an impurity concentration of a semiconductor substrate, $m^*$ is an effective mass of carriers in the semiconductor substrate, $\epsilon_s$ is a dielectric constant of semiconductor material, q is an electronic charge, h is a Planck's constant, and C is a constant.

As seen from the equation (1), the contact resistance can be lowered by increasing the impurity concentration $N_D$. However, impurities near a limit of solid solubility are doped presently and it is difficult to increase the impurity concentration higher than the present level.

SUMMARY OF THE INVENTION

It is an object of the present invention to provide a semiconductor device and a manufacture method thereof capable of lowering a contact resistance between impurity doped regions of a silicon substrate and a metal wiring layer.

According to one aspect of the present invention, there is provided a semiconductor device comprising:

a silicon substrate; a plurality of impurity doped regions formed in a surface layer of the silicon substrate; contact layers each in contact with a surface of associated one of the plurality of impurity doped regions, the contact layer being made of an alloy selected from a group consisting of TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HfTa, TiZrTa, TiHfTa, and TiZrHfTa; barrier layers each disposed on associated one of the contact layers and made of refractory metal nitride or refractory metal oxynitride; and a metal wiring layer disposed on each of the barrier layers.

According to another aspect of the present invention, there is provided a method of manufacturing a semiconductor device comprising the steps of: forming n-type impurity doped regions and p-type impurity doped regions in a surface layer of a silicon substrate; depositing an interlayer insulating film on the silicon substrate; forming contact holes through the interlayer insulating film, each of the contact holes exposing a partial surface of one of the n-type impurity doped regions and the p-type impurity doped regions; forming a contact layer on inner walls of the contact holes and on a surface of the interlayer insulating film, the contact layer being made of an alloy selected from a group consisting of TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HfTa, TiZrTa, TiHfTa, and TiZrHfTa; forming a barrier layer made of metal nitride or metal oxynitride on a surface of the contact layer, by nitriding a surface layer of the contact layer in a nitrogen atmosphere or by oxynitriding a surface layer of the contact layer in an atmosphere containing oxygen and nitrogen; and forming a metal wiring layer on the barrier layer.

According to a further aspect of the present invention, there is provided a method of manufacturing a semiconductor device comprising the steps of: forming n-type impurity doped regions and p-type impurity doped regions in a surface layer of a silicon substrate; depositing an interlayer insulating film on the silicon substrate; forming contact holes through the interlayer insulating film, each of the contact holes exposing a partial surface of associated one of the n-type impurity doped regions and the p-type impurity doped regions; forming a contact layer on inner walls of the contact holes and on a surface of the interlayer insulating film, the contact layer being made through sputtering by using as a target an alloy selected from a group consisting of TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HfTa, TiZrTa, TiHfTa, and TiZrHfTa, and by using as a sputtering gas a rare gas; and succeedingly after the contact layer forming step, depositing a barrier layer of nitride or oxynitride of the alloy on the contact layer, by reactive sputtering using as a sputtering gas a gas containing at least nitrogen gas, or a gas containing a nitrogen gas and an oxygen gas.

The contact layer is made of an alloy of a metal having a standard heat of formation larger than that of Si and a metal having a standard heat of formation smaller than that of Si. By adjusting the composition of the alloy, the Schottky barriers at interfaces between the contact layers and n-type and p-type impurity doped regions in the surface layer of the silicon substrate can be controlled to have desired values. It can therefore balance the contact resistances of both the n-type and p-type regions.

Since the metal element having a standard heat of formation larger than that of Si reduces a natural oxide film formed on the surface of a silicon substrate, an increase in the contact resistance to be caused by a presence of the natural oxide film can be suppressed.

As above, the contact resistance between an impurity doped region and a wiring layer can be lowered by contacting an alloy made of a combination of a metal having a standard heat of formation larger than Si and a metal having a standard heat of formation smaller than Si, to the impurity doped regions in the surface area of the silicon substrate.

DETAILED DESCRIPTION OF THE PREFERRED EMBODIMENTS

Prior to describing the embodiments of the invention, a relation between a contact resistance and a Schottky barrier at an interface between semiconductor and metal will be described. As seen from the equation (1), the contact resistance can be lowered by selecting material having a small Schottky barrier $\phi_B$. In an integrated circuit device using a silicon substrate, it is necessary to contact metal wiring layers to both an n-type diffused region doped with As, P or the like and a p-type diffused region doped with B or the like. The following relation is known:

$$E_g \approx \phi_{Bn} + \phi_{Bp} \quad (2)$$

where Eg is a bandgap of Si, $\phi_{Bn}$ is a Schottky barrier for the n-type Si, and $\phi_{Bp}$ is a Schottky barrier for the p-type Si.

As seen from the formula (2), since a sum of $\phi_{Bn}+\phi_{Bp}$ is nearly constant, if the Schottky barrier $\phi_B$ for one of n- and p-type diffused regions is made low, that for the other region becomes high. In order to lower the contact resistance of both the n- and p-type diffused regions, it is preferable to select such metal material that both $\phi_{Bn}$ and $\phi_{Bp}$ have about a half the Si bandgap, i.e., about 0.56 eV.

Figure 5:
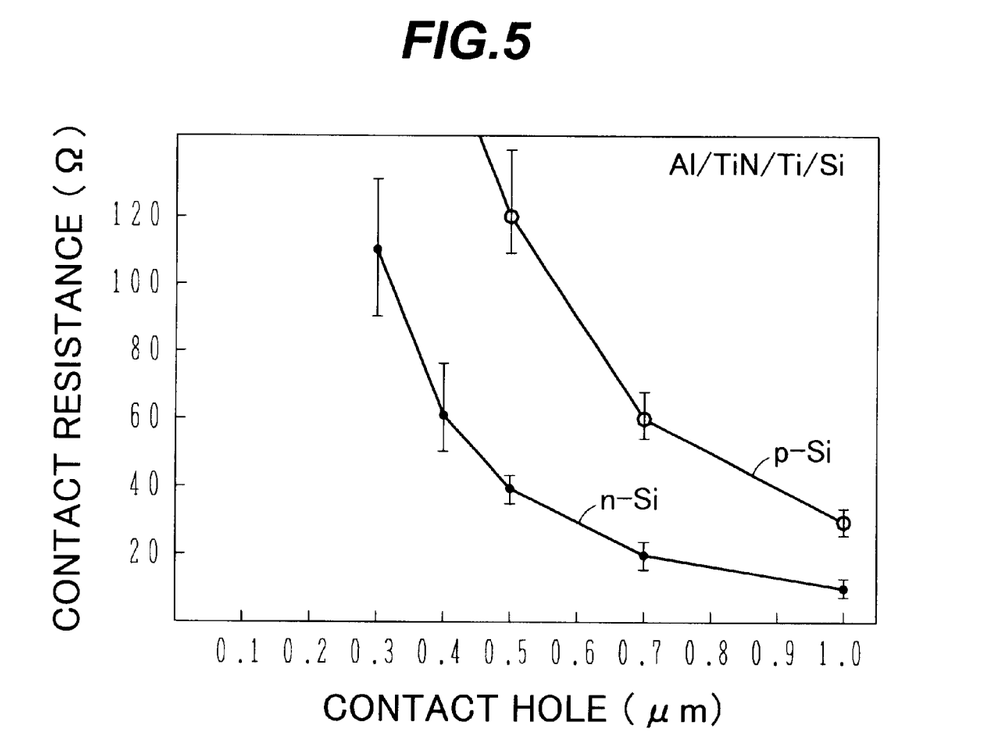
FIG. 5 is a graph showing a contact resistance between impurity doped regions of a silicon substrate and a wiring layer, as a function of a contact hole diameter.

FIG. 5 shows a contact resistance between wiring layers and impurity diffused regions in a surface layer of a silicon substrate, the wiring layer being an Al wiring layer under which a barrier layer of TiN and a contact layer of Ti on the silicon substrate are formed. The abscissa represents a contact hole diameter in the unit of $\mu$m, and the ordinate represents a contact resistance in the unit of $\Omega$. Solid circles and open circles in FIG. 5 indicate the contact resistances of the n- and p-type diffused regions, respectively. The impurity concentration of the n-type diffused region is $4\times10^{20}$ cm$^{-3}$, and that of the p-type diffused region is $2\times10^{20}$ cm$^{-3}$.

The Schottky barrier $\phi_{Bn}$ at the interface between metal Ti and n-type Si is about 0.52 eV which is about a half the Si bandgap of 0.56 eV. Therefore, Ti is a material suitable for lowering the contact resistances of both n-type Si and p-type Si.

However, as shown in FIG. 5, the contact resistance of the p-type Si is about three times that of the n-type Si. A variation of contact resistances becomes large in the range of the contact hole diameter not larger than 0.5 $\mu$m. This may be ascribed to damages, natural oxide films and the like formed on the silicon substrate surface when a contact hole is formed. In order to lower the contact resistance of the p-type Si, material having a low Schottky barrier to the p-type Si is used. However, in this case, the Schottky barrier to the n-type Si becomes high and the contact resistance increases.

Next, with reference to FIG. 1, a semiconductor device according to the first embodiment of the invention will be described.

Figure 1:
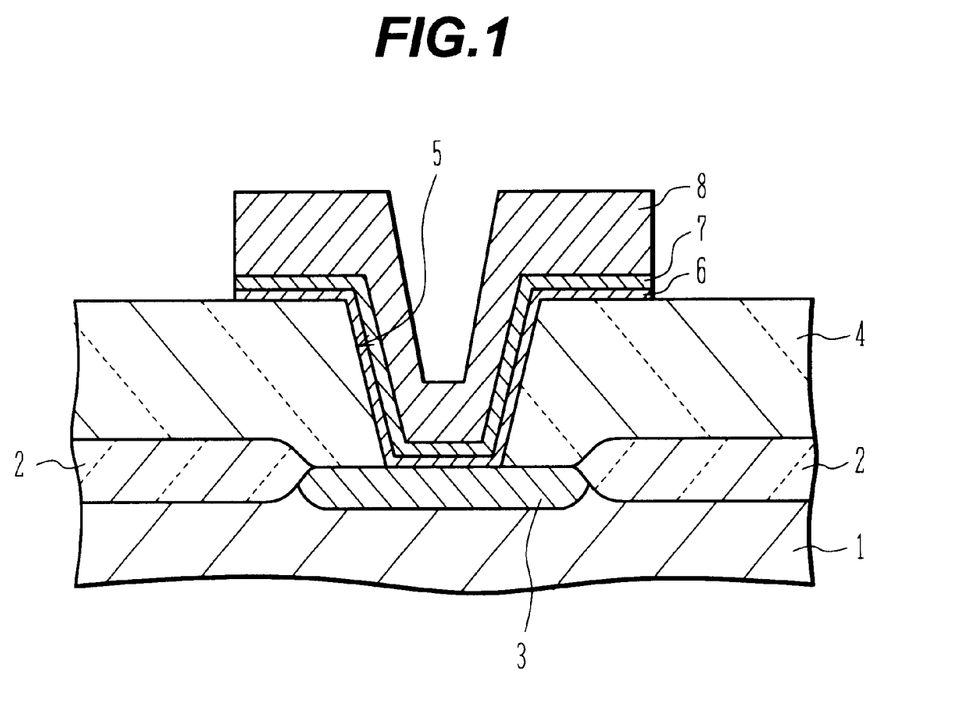
FIG. 1 is a cross sectional view of a semiconductor device according to a first embodiment of the invention.

FIG. 1 is a cross sectional view showing a contact area between a wiring layer and an impurity diffused region in the surface layer of a silicon substrate. An active region is defined by a field oxide film 2 formed on the surface of a silicon substrate 1 by local oxidation of silicon (LOCOS). In a surface layer of this active region, a diffused region 3 heavily doped with impurities is formed. An interlayer insulating film 4 is formed on the surface of the silicon substrate 1. A contact hole 5 is formed through the interlayer insulating film 4, exposing a partial surface of the diffused region 3.

A lamination structure made of three layers including a contact layer 6, a barrier layer 7 and a wiring layer 8 is formed continuously covering the inner wall of the contact hole and a partial upper surface of the interlayer insulating film 4.

The contact layer 6 is made of an alloy selected from a group consisting of TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, and TiZrHfNbTa. The barrier layer 7 is made of nitride or oxynitride of the alloy of the contact layer 6. The wiring layer 8 is made of Al or Al alloy.

The barrier layer 7 is formed, for example, by heat treatment of the substrate in a nitrogen atmosphere after the contact layer 6 is deposited, to thereby nitride a surface layer of the contact layer 6. Alternatively, it may be formed by depositing the contact layer 6 through sputtering in Ar gas and thereafter introducing nitrogen gas into the sputtering gas to perform reactive sputtering.

The contact layer 6 includes a metal or metals of a first group having a standard heat of formation larger than Si, i.e., metals which can be oxidized more easily than Si, and a metal or metals of a second group having a standard heat of formation smaller than Si. The first group metals include Ti, Zr, Hf and the like, and the second group metals include V, Mo, W, Ta, Nb and the like.

The Schottky barrier $\phi_{Bn}$ at the interface between the first group metal and n-type Si is about 0.6 eV or lower, and the Schottky barrier relative to the second group metal is about 0.6 eV or higher. It can be said therefore that the first group metal is suitable for contact with n-type Si, whereas the second group metal is suitable for contact with p-type Si.

Since the first group metal is oxidized more easily than Si, it reduces a natural oxide film formed on the Si surface so that good electrical contact is obtained. The contact layer 6 containing the first group metal or metals improve adhesion between the interlayer insulating film and the barrier and wiring layers. It is therefore possible to prevent a wiring pattern fall or a pattern missing that the pattern is moved on the interlayer insulating film and then is peeled off from the film.

If the contact layer 6 is made of a combination of the first and second group metals, at least one metal being selected from each of the first and second groups, it is preferable to select a combination which forms solid solution, and it is not preferable to select a combination which forms metal compound. From this viewpoint, the contact layer 6 is preferably made of refractory metal alloy such as TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, and TiZrHfNbTa.

A combination of the first and second group metals is selected to adjust the Schottky barriers $\phi_{Bn}$ and $\phi_{Bp}$ relative to silicon so that low contact resistances of both n-type Si and p-type Si can be obtained. If a combination which forms solid solution in the whole composition region is selected, the degree of freedom of setting the value of the Schottky barrier $\phi_{Bn}$ can be broadened.

The composition of the first group metal in the alloy of the first and the second group metals is preferably about 50 mole % to about 80 mole %. The first group metal Hf has a low Schottky barrier height $\phi_{Bn}$ of 0.46 eV, and enables wide selection of overall $\phi_{Bn}$. The second group metals Nb and Mo have a high Schottky barrier height $\phi_{Bn}$ of 0.65 eV or more, and enables wide selection of overall $\phi_{Bn}$. The second group metal Ta has a low Schottky barrier height $\phi_{Bn}$ of 0.59 eV, but provides a large density of 13.26 g/cm$^3$ at 20° C. when nitrided to TaN, which is expected to show a high barrier function. The second group metal nitride WN also provides a large density of 12.12 g/cm$^3$. These values may be compared to the density of 4.08 g/cm$^3$ for the first group metal nitride TiN.

The second group metal of the contact layer 6 forms diffusion species on the silicon substrate and makes Si alloy. Since the substantial interface between metal and Si becomes deeper than the uppermost substrate surface on which dry etching damages are left when the contact hole is formed, a clean interface can be obtained and the contact resistance can be lowered.

In this embodiment, the barrier layer can be formed easily by heat treatment of the substrate in a nitrogen atmosphere to thereby nitride the surface layer of the contact layer, or by reactive sputtering by introducing nitrogen gas into the sputtering gas used for deposition of the contact layer.

Next, a method of manufacturing a semiconductor device according to the second embodiment of the invention will be described by taking as an example the formation of n- and p-channel MOSFETs.

Figure 2A:
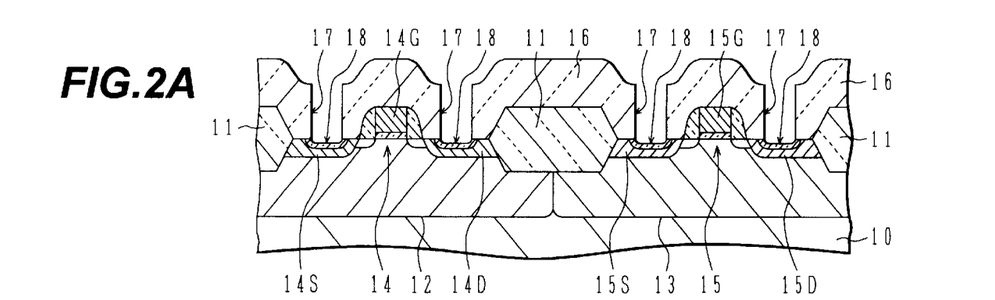
FIGS. 2A to 2D are cross sectional views of a semiconductor substrate illustrating a manufacture method according to a second embodiment of the invention, as applied to connection between source/drain regions of MOSFET and a wiring layer.

As shown in FIG. 2A, an n-type well 12 and a p-type well 13 are formed at the left and right sides in a surface layer of a p-type silicon substrate 10 having a plane (1 0 0), a resistivity of 4 Ω·cm and an oxygen concentration of 1.5× 10$^{17}$ cm$^{-3}$. A field oxide film 11 formed on the surface of the silicon substrate 10 defines active regions in the n-type well 12 and the p-type well 13.

A p-channel MOSFET 14 is formed in the active region of the n-type well 12, the p-channel MOSFET 14 having a source region 14S, a drain region 14D and a gate electrode 14G. An n-channel MOSFET 15 is formed in the active region of the p-type well 13, the n-channel MOSFET 15 having a source region 15S, a drain region 15D and a gate electrode 15G.

On the side walls of each of the gate electrodes 14G and 15G, spacer insulators are formed. These spacer insulators are used as masks for heavily implanting ions in a high concentration region of a lightly doped drain (LDD) structure.

An interlayer insulating film 16 is formed over the whole substrate surface, covering the MOSFETs 14 and 15. This interlayer insulating film 16 has a two-layer structure of phosphosilicate glass (PSG) and borophosphosilicate glass (BPSG), and has a total thickness of 0.4 to 1.0 μm or preferably 0.8 μm. The phosphorous (P) concentration of the PSG film is 3 to 10 weight % or preferably 8 weight %. The P concentration of the BPSG film is 3 to 8 weight % and the boron (B) concentration thereof is 5 to 12 weight % or preferably 5 weight % and 9 weight %, respectively.

Contact holes are formed through the interlayer insulating film 16 at predetermined positions, by anisotropic etching using a resist pattern as a mask. On the bottom surfaces of the contact holes, partial surfaces of the source/drain regions 14S, 14D, 15S and 15D are exposed. For example, the interlayer insulating film 16 is etched by magnetron reactive etching under the conditions of CF$_4$ at a flow rate of 5 sccm, CHF$_3$ at a flow rate of 30 sccm, and Ar at a flow rate of 100 sccm as etching gases, a pressure of 200 mTorr, an RF power (13.56 MHz) of 700 W, and a magnetic field intensity of 40 Gauses. Under these conditions, an etching rate of the BPSG film is 450+/−20 nm/min, allowing a contact hole having a desired shape to be formed. The bottom surface of each contact hole has a natural oxide film 18 formed thereon. This oxide film 18 left on the bottom surface of the contact hole is removed by dry-etching after the contact hole is formed to expose the Si substrate. The uppermost surface of the exposed Si substrate has a layer damaged during etching. In order to removed the damaged layer and clean the Si uppermost surface, the substrate is washed and etched by using buffered hydrofluoric acid (BHF).

The oxide film on the uppermost surface of the Si substrate is therefore removed by the above process.

An etching time for the interlayer insulating film 16 is set to a total of a time (main etching time) required to etch just the whole thickness of the film at the above-described etching rate added with a time (over-etching time) of 30 to 100% of the main etching time or preferably about 50%.

Figure 2B:
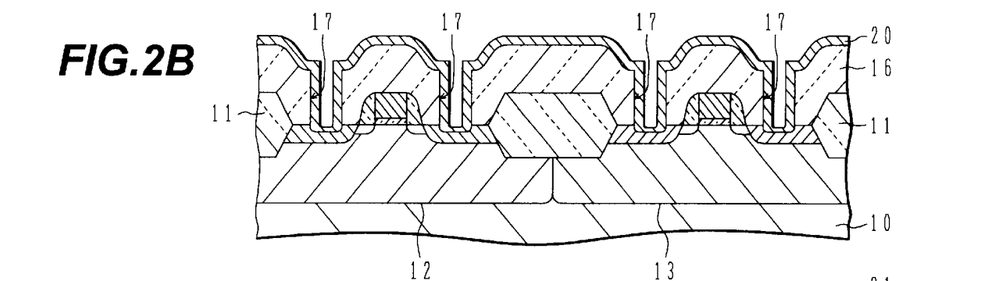

As shown in FIG. 2B, a contact layer 20 of TiMo alloy having a thickness of 5 to 50 nm or preferably 20 nm is deposited on the inner walls of the contact holes 17 and the upper surface of the interlayer insulating film 16. The main role of the contact layer 20 is to form a low resistance contact on the Si surface. For example, the contact layer 20 is deposited by DC magnetron sputtering under the conditions of Ar gas at a flow rate of 30 sccm as sputtering gas, a substrate temperature of 150° C., a pressure of 3 mTorr and an applied power of 1150 W. Since the TiM0 alloy film is formed in contact with the Si substrate on the bottom of the contact holes, a natural oxide 18 film formed after the above-described cleaning process is reduced and removed. It is therefore unnecessary to perform again a process of removing the natural oxide film 18 by etching or the like.

The composition of Ti in the TiMo alloy is preferably 50 weight % to 85 weight % (50 weight % to 15 weight % of Mo), corresponding to $\phi_{Bn}$ of 0.55 eV to 0.6 eV. The Schottky barrier height is about a half of the Si bandgap. The Ti content is sufficient to consume thin native oxide films. The metal Mo advantageously has a low resistivity of 4.77

μΩcm at 20° C. (while Ti has a resistivity of 47 μΩcm at 20° C.), which is effective to reduce the overall contact resistance.

Ti atoms are lighter than Mo atoms so that Ti atoms are more easily sputtered than Mo atoms. When Ti and Mo are sputtered at the same time from a single target, a Ti composition in the TiMo film becomes larger than a Ti composition of the sputtering target. It is therefore preferable to set the Ti composition of the sputtering target smaller than a final Ti composition of the TiMo film. For example, this Ti composition of the target is preferably set to smaller by several to ten weight % or preferably about 5 weight % than the final composition.

The TiMo alloy film may be deposited by co-sputtering a Ti target and a Mo target.

Preferably, collimated sputtering, long throw sputtering or the like may be used in order to form the contact film reaching the bottom surface of a fine contact hole, with good reproductivity.

Figure 2C:
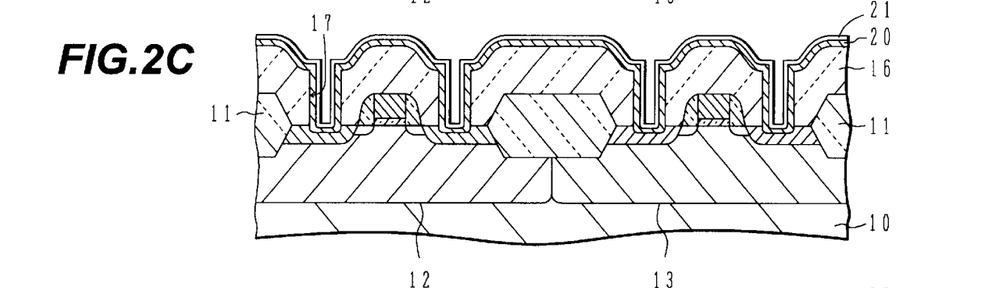

As shown in FIG. 2C, a barrier layer 21 is formed on the surface of the contact layer 20, the barrier layer 20 being made of $TiMoN_x$ (x is about 1.0) or $TiMoN_xO_y$ (x=0.9, y=0.1). A main role of the barrier layer 21 is to prevent mutual diffusion between a wiring layer to be formed on the barrier layer 21 and the underlying Si substrate 10. The barrier layer 21 is deposited by additionally introducing nitrogen gas or nitrogen and oxygen gases into the sputtering gas used for depositing the contact layer 20.

A film thickness of the barrier layer 21 is, for example, several to 250 nm, preferably 50 to 150 nm, or more preferably about 100 nm.

For example, the TiMoN film is deposited under the conditions of an Ar gas flow rate of 50 sccm, a nitrogen gas flow rate of 90 sccm, a pressure of 4 mTorr, and an applied power of 530 W. For example, the TiMoNO film is deposited under the conditions of an Ar gas flow rate of 50 sccm, an oxygen gas flow rate of 10 sccm, a nitrogen gas flow rate of 90 sccm, a pressure of 4 mTorr, and an applied power of 530 W. After the TiMoN film is deposited 10 to 100 nm thick, the TiMoNO film may be deposited 30 to 100 nm thick.

After the barrier layer 21 is deposited, the substrate is heated with a lamp in an nitrogen atmosphere, rapidly to a substrate temperature of about 500 to 800° C., and a heat treatment is performed for 10 to 60 seconds. This heat treatment improves thermal endurance and barrier performance of the barrier layer 21.

The barrier layer 21 may be formed by performing a heat treatment of the substrate with the contact layer 20 deposited at the process of FIG. 2B in a nitrogen or ammonium atmosphere to thereby nitride the surface layer of the contact layer 20. Only the surface layer of the contact layer 20 can be nitrided without affecting the impurity concentration distribution of the impurity diffused regions formed on the silicon substrate, by performing the heat treatment for 5 to 30 seconds or preferably for about 15 seconds at a heat treatment temperature of 500 to 900° C. or preferably 700° C.

With the above-described sputtering and thermal nitridation method, the barrier layer 21 is made of nitride of a metal alloy having the same composition as the contact layer 20. After the contact layer 20 is deposited, the sputtering target may be exchanged to deposit the barrier layer 21 made of nitride of a different refractory metal such as TiN. The barrier layer 21 may be made of boride of metal alloy having the same composition as the contact layer 20, or may be made of a lamination of these films.

Figure 2D:
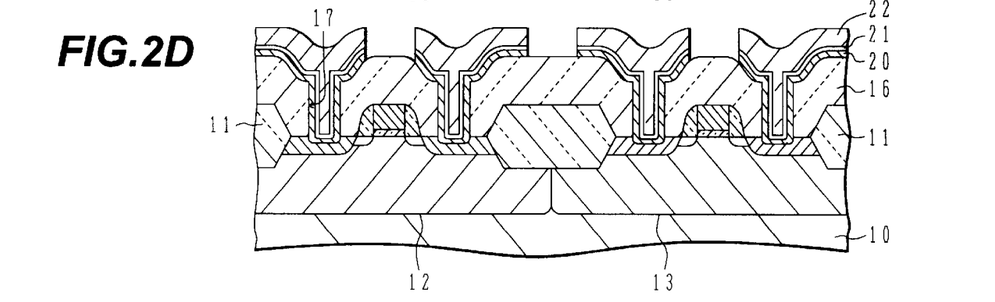

As shown in FIG. 2D, a wiring layer is deposited on the barrier layer 21 and patterned to form a wiring pattern 22.

The barrier layer 21 and contact layer 20 are patterned to have the same pattern as the wiring pattern 22. The wiring pattern 22 is made of Al or Al alloy such as AlSi and AlSiCu, and has a film thickness of 100 to 1000 nm or preferably 500 nm.

For example, the Al alloy film is deposited by DC sputtering under the conditions of a target of Al alloy, an Ar sputtering gas at a flow rate of 33 sccm, a substrate temperature of 200° C., a pressure of 2 mTorr, and an applied power of 9000 W. After the Al alloy film is deposited, the substrate is heated to 400 to 550° C. to perform a reflow process, without breaking a vacuum (evacuated low pressure atmosphere). A main role of this reflow process is to fluidize Al or Al alloy to form a wiring layer which can sufficiently fill holes or concaves. The contact holes are completely filled with Al alloy. If collimated sputtering, long throw sputtering or the like is utilized, a film having a sufficient initial thickness can be deposited even in a fine contact hole.

Instead of Al or Al alloy, the wiring pattern 22 may be made of Cu or Cu alloy such as Cu, CuCr, CuZr, and CuPd.

In the above embodiment, after the wiring layer is deposited by sputtering, the reflow process is performed. Instead, while the wiring layer is formed by sputtering, the substrate temperature may be gradually raised to finally reach 400 to 550° C.

The wiring layer may be deposited by chemical vapor deposition (CVD). The advantage of CVD deposition is that the contact hole can be easily filled with wiring material even if the contact hole is made finer and the opening area thereof becomes smaller. For example, an Al film is deposited under the conditions of a source gas of dimethyl aluminum hydride (DMAH) or the like, a hydrogen carrier gas, a substrate temperature of 100 to 250° C., and a gas flow of 200 to 500 sccm. If a substrate temperature is set low, the deposited Al film is less fluidized so that it is deposited generally conformal to the underlying layer. A reflow process after the Al film is deposited can planarize the surface of the Al film.

For example, the three layers including the wiring layer 22, the barrier layer 21 and the contact layer 20 are patterned in an inductively coupled plasma etcher after a resist; pattern is formed on the wiring layer. For example, the wiring layer 22 is etched under the conditions of a $Cl_2$ gas at a flow rate of 40 sccm and a $BCl_3$ gas at a flow rate of 20 sccm as etching gases, a pressure of 15 mTorr, an RF power (13.56 MHz) of 350 W applied to a coil and an RF power (13.56 MHz) of 175 W applied to a lower electrode.

The barrier layer 21 and contact layer 20 are patterned under the conditions of a $Cl_2$ gas at a flow rate of 30 sccm and a $BCl_3$ gas at a flow rate of 30 sccm as etching gases, a pressure of 10 mTorr, an RF power of 340 W applied to a coil and an RF power of 120 W applied to a lower electrode. After the contact layer 20 is etched, an over-etching is performed. An over-etching time is, for example, about 60 to 90% of the etching time required to etch just the whole thickness from the wiring layer 22 to the contact layer 20.

Next, with reference to FIGS. 3A to 3D, the semiconductor device manufacturing method according to the third embodiment will be described. Processes similar to those associated with FIG. 2A are applied to this embodiment.

Figure 3A:
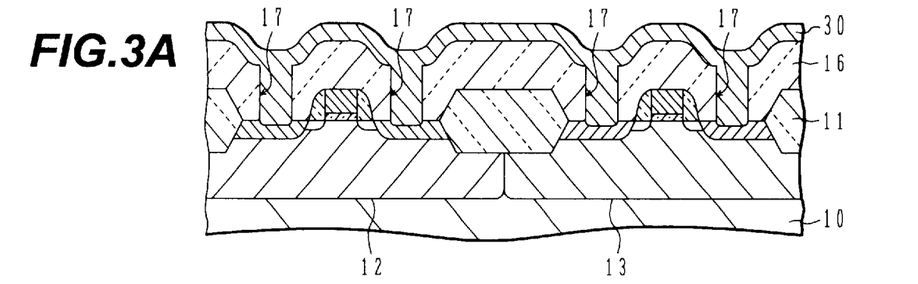
FIGS. 3A to 3D are cross sectional views of a semiconductor substrate illustrating a manufacture method according to a third embodiment of the invention, as applied to connection between source/drain regions of MOSFET and a wiring layer.

As shown in FIG. 3A, a contact layer 30 of TiMo is deposited by DC sputtering, filling the insides of contact holes 17. A target used is the same as that used for depositing the contact layer 20 shown in FIG. 2B, the sputtering gas is Ar gas at a flow rate of 300 sccm, the substrate temperature is set to 150° C., the pressure is set to 3 mTorr, and an applied power is set to 1200 W. Since the contact layer 30 is formed in contact with the substrate, a natural oxide left on the substrate surface is extinguished.

Figure 3B:
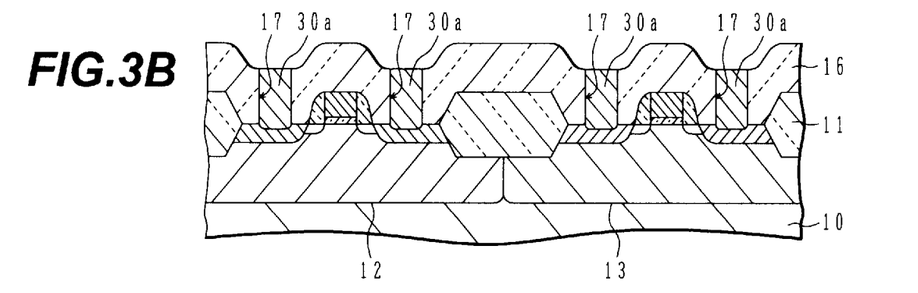

As shown in FIG. 3B, the contact layer 30 is anisotropically dry-etched by RIE or the like, and only plugs 30a are left in the contact holes 17. For example, the contact layer 30 is etched under the conditions of an $SF_6$ gas at a flow rate of 30 to 140 sccm or preferably 110 sccm and an Ar gas at a flow rate of 40 to 140 sccm or preferably 90 sccm as etching gases, an applied RF power of 450 W and a pressure of 32 Pa (240 mTorr). The end point of the etching is detected by observing a radiation intensity of $F^+$. The timing when the radiation intensity increases is judged as the end point.

After the contact layer 30 is etched, an over-etch is performed. This over-etching is performed under the conditions of an $SF_6$ gas at a flow rate of 50 to 180 sccm or preferably 80 sccm and an Ar gas at a flow rate of 0 to 90 sccm or preferably 60 sccm as etching gases, an applied RF power of 200 W and a pressure of 28 Pa (210 mTorr).

Figure 3C:
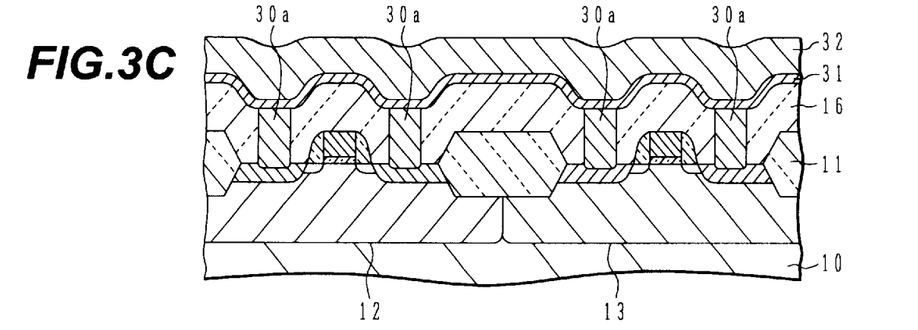

As shown in FIG. 3C, a barrier layer 31 and a wiring layer 32 are deposited on the surface of the interlayer insulating film 16 and plugs 30a. This barrier layer 31 is deposited by sputtering under the same conditions as sputtering the barrier layer 21 shown in FIG. 2C, and the wiring layer 32 is deposited under the same conditions as depositing the wiring layer 22 shown in FIG. 2D.

A film thickness of the barrier layer 31 may be thinner than that of FIG. 2C, and is several to 250 nm, preferably 30 to 100 nm, or more preferably 50 nm. The barrier layer 31 also functions as an adhesion layer for the wiring layer 32 formed by CVD.

Before the barrier layer 31 is deposited, an alloy layer may be deposited thinly by the same method as used for the contact layer 30 shown in FIG. 3A. This alloy layer improves adhesion of the barrier layer 31 to the interlayer insulating film 16 and plugs 30a.

Figure 3D:
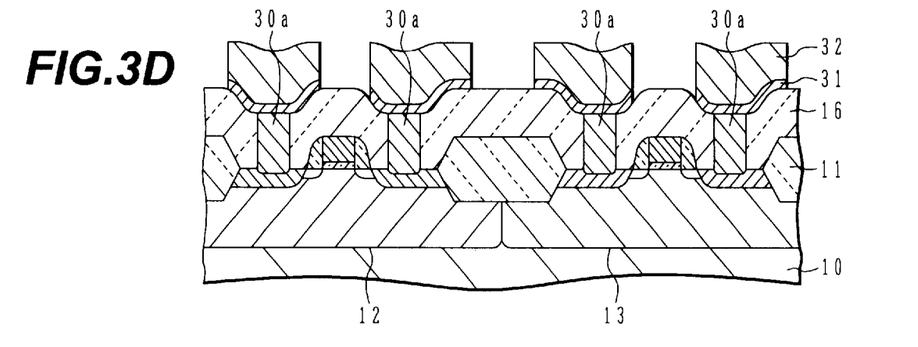

As shown in FIG. 3D, the barrier layer 31 and wiring layer 32 are patterned by the same method as used in the step of FIG. 2D to form a wiring pattern.

The contact layer 30 shown in FIG. 3A may be deposited by CVD. For example, if TiW alloy is to be deposited, it is deposited under the conditions of $TiCl_4$ and $WF_6$ at flow rates of 40 sccm and 40 sccm as source gases, $H_2$ and Ar at flow rates of 400 sccm and 2250 sccm as carrier gases, a pressure of 10 kPa (75 Torr), and a substrate temperature of 450° C.

In place of W, other metals providing compound gases having a low boiling point and a high vapor pressure may also be used, such as $MoF_6$ (film forming temperature of 400 to 800° C.), $TaF_2$ (film forming temperature of 600 to 1000° C.), $TiCl_4$ (film forming temperature of 350 to 600° C.) and $Ni(CO)_4$ (film forming temperature of 100 to 300° C.).

A film may be deposited 10 to 150 nm thick by sputtering first and thereafter the contact holes may be filled by depositing a conductive material by CVD. This film deposited by sputtering functions as an adhesion layer which improves an adhesion of the film deposited by CVD.

Metal may be deposited under such conditions that the metal grows selectively only on the silicon surface exposed on the bottom of the contact hole, so that the metal plugs can be grown only in the contact holes 17.

Figure 4A:
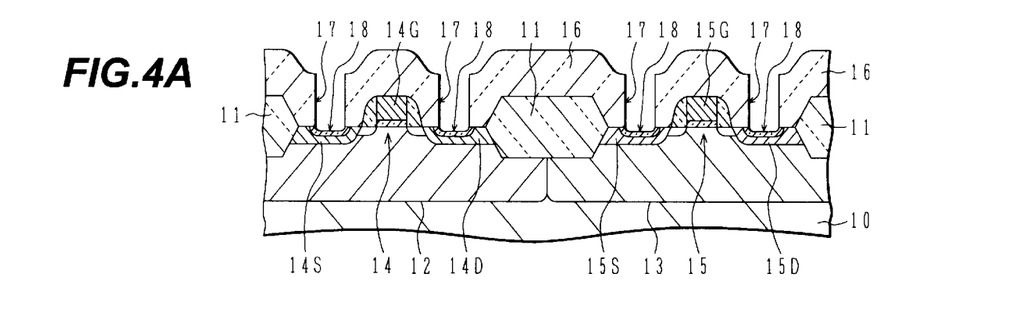
FIGS. 4A to 4C are cross sectional views of a semiconductor substrate illustrating a manufacture method according to a fourth embodiment of the invention, as applied to connection between source/drain regions of MOSFET and a wiring layer.
Figure 4B:
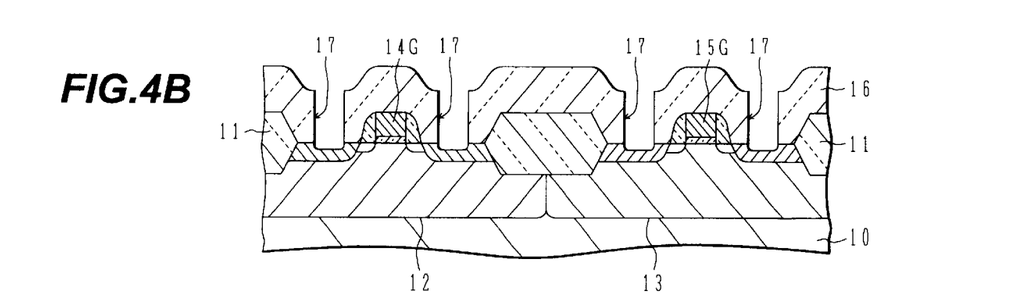
Figure 4C:
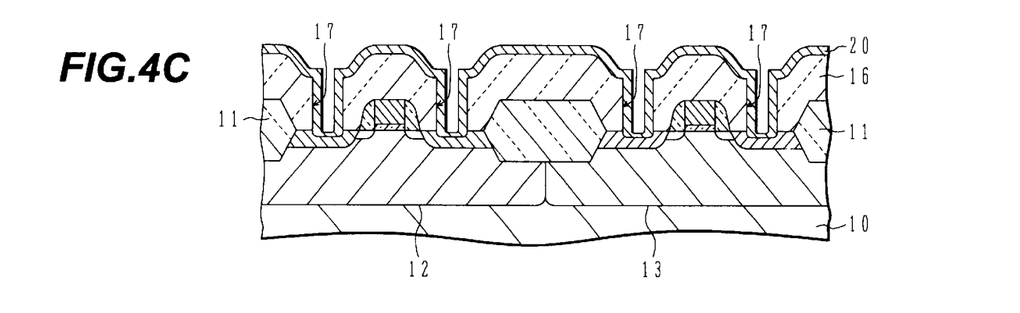

With reference to FIGS. 4A to 4C, the fourth embodiment of the invention will be described.

The cross sectional view of FIG. 4A is the same as FIG. 2A of the second embodiment. Constituents shown in FIGS. 4A to 4C are represented by identical reference numerals to those of the corresponding constituents shown in FIGS. 2A to 2D.

Also in the case of the semiconductor substrate shown in FIG. 4A, a natural oxide film 18 is left on the bottom of a contact hole.

As shown in FIG. 4B, the natural oxide film 18 left on the bottom of the contact hole is wet-etched to remove it. This wet etching is performed by using buffered hydrofluoric acid (BHF).

As shown in FIG. 4C, after the natural oxide film on the bottom of the contact hole is removed, a contact layer 30 of TiMo alloy is deposited over the substrate under the same conditions as the second embodiment. Instead of TiMo alloy, the contact layer 30 may be made of another material enumerated in the second embodiment, such as TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, and TiZrHfNbTa.

In the fourth embodiment, since the natural oxide film 18 is removed again by wet-etching, metals constituting metal alloy can be selected only by taking the Schottky barrier $\phi_{Bn}$ into consideration without considering the standard heat of formation. Namely, metals to be selected have the Schottky barrier $\phi_{Bn}$ at the interface between the first group metal and n-type Si of about 0.6 eV or lower, and the Schottky barrier relative to the second group metal of about 0.6 eV or higher.

Metals satisfying the above conditions may be TiTa, ZrTa, HfTa, TiZrTa, TiHfTa, TiZrHfTa and the like.

The process of FIG. 4C is the same as the process shown in FIG. 2C of the second embodiment.

The processes of the fourth embodiments may be applied to the structure of the third embodiment.

In the semiconductor devices formed by the second and third embodiment methods shown in FIGS. 2A to 2D and in FIGS. 3A to 3D, the source/drain regions in the surface layer of the silicon substrate are in contact with TiMo alloy. Therefore, similar to the first embodiment shown in FIG. 1, a contact resistance can be lowered. Desired contact resistances can be obtained both for the p- and n-type regions.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device comprising the steps of:

forming n-type impurity doped regions and p-type impurity doped regions in a surface layer of a silicon substrate;

depositing an interlayer insulating film on the silicon substrate;

forming contact holes through the interlayer insulating film, each of the contact holes exposing a partial surface of one of the n-type impurity doped regions and the p-type impurity doped regions;

forming a contact layer by collimated sputtering or long throw sputtering on inner walls of the contact holes and on a surface of the interlayer insulating film, the contact layer being made of an alloy selected from a group consisting of TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HTra, TiZrTa, TiHfTa, and TiZrHfTa;

forming a barrier layer made of metal nitride or metal oxynitride on a surface of the contact layer, by nitriding a surface layer of the contact layer in a nitrogen atmosphere or by oxynitriding a surface layer of the contact layer in an atmosphere containing oxygen and nitrogen; and forming a metal wiring layer on the barrier layer.

2. A method of manufacturing a semiconductor device comprising the steps of:

forming n-type impurity doped regions and p-type impurity doped regions in a surface layer of a silicon substrate;

depositing an interlayer insulating film on the silicon substrate;

forming contact holes through the interlayer insulating film, each of the contact hole exposing a partial surface of associated one of the n-type impurity doped regions and the p-type impurity doped regions;

forming a contact layer on inner walls of the contact holes and on a surface of the interlayer insulating film, the contact layer being made through sputtering by using as a target an alloy selected from a group consisting of TiMo, TiNb, TiV, TiW, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HfTa, TiZrTa, TiHfTa, and TiZrHfTa, and by using as a sputtering gas a rare gas; and succeedingly after the contact layer forming step, depositing a barrier layer of nitride or oxynitride of the alloy on the contact layer, by reactive sputtering using as a sputtering gas a gas containing at least nitrogen gas, or a gas containing a nitrogen gas and an oxygen gas.

3. A method according to claim 2, wherein the contact layer forming step forms the contact layer by collimated sputtering or long throw sputtering.

4. A method according to claim 2, wherein the contact layer forming step and the barrier layer forming step include collimate sputtering or long throw sputtering.

5. A method according to claim 2, wherein the metal wiring layer is an Al layer or an Al alloy layer.

6. A method according to claim 5, further comprising the step of heating and reflowing the metal wiring layer.

7. A method according to claim 2, further comprising the step of, after the step of forming contact holes and before the step of forming the contact layer, removing an oxide film on a surface of the silicon substrate.

8. A semiconductor device comprising:

a silicon substrate;

a plurality of impurity doped regions formed in a surface layer of the silicon substrate, comprising n-type regions and p-type regions;

contact layers in contact with a surface of said n-type and p-type regions, each of the contact layers being made of an alloy selected from a group consisting of TiMo, TiNb, TiV, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HfTa, TiZrTa, TiHfTa, and TiZrHfTa;

barrier layers each disposed on associated one of the contact layers and made of refractory metal nitride or refractory metal oxynitride; and a metal wiring layer disposed on each of the barrier layers.

9. A semiconductor device according to claim 8, further comprising an interlayer insulating film formed over the silicon substrate and having an opening exposing a partial surface of each of the plurality of impurity doped regions.

10. A semiconductor device according to claim 9, wherein the contact layer, the barrier layer, and the metal wiring layer fill an inside of the opening.

11. A semiconductor device according to claim 9, wherein the contact layer forms a plug filling an inside of the opening.

12. A semiconductor device according to claim 9, wherein the metal wiring is an Al layer or an Al alloy layer.

13. A method of manufacturing a semiconductor device comprising the steps of:

forming n-type impurity doped regions and p-type impurity doped regions in a surface layer of a silicon substrate;

depositing an interlayer insulating film on the silicon substrate;

forming contact holes through the interlayer insulating film, the contact holes exposing a partial surface of the n-type impurity doped regions and the p-type impurity doped regions;

forming a contact layer on inner walls of the contact holes and on a surface of the interlayer insulating film, the contact layer being made of an alloy selected from a group consisting of TiMo, TiNb, TiV, TiMoNb, TiMoTa, TiMoV, TiMoW, TiNbTa, TiNbV, TiNbW, TiMoNbTa, TiMoNbV, TiMoNbW, TiMoTaW, TiMoVW, TiNbTaW, TiNbVW, TiMoNbTaW, TiMoNbVW, ZrNb, ZrNbTa, HfNb, HfNbTa, TiZrNbTa, TiHfNb, TiHfNbTa, TiZrHfNb, TiZrHfNbTa, TiTa, ZrTa, HfTa, TiZrTa, TiHfTa, and TiZrHfTa;

forming a barrier layer made of metal nitride or metal oxynitride on a surface of the contact layer, by nitriding a surface layer of the contact layer in a nitrogen atmosphere or by oxynitriding a surface layer of the contact layer in an atmosphere containing oxygen and nitrogen; and forming a metal wiring layer on the barrier layer.

14. A method according to claim 13, wherein the contact layer forming step forms the contact layer by collimated sputtering or long throw sputtering.

15. A method according to claim 13, wherein the metal wiring layer is an Al layer or an Al alloy layer.

16. A method according to claim 15, further comprising the step of heating and reflowing the metal wiring layer.

17. A method according to claim 13, further comprising the step of, after the step of forming the contact holes and before the step of forming the contact layer, removing an oxide film on a surface of the silicon substrate.

* * * * *